United States Patent
Dong et al.

(10) Patent No.: US 6,803,277 B1
(45) Date of Patent: Oct. 12, 2004

(54) METHOD OF FORMING GATE ELECTRODE IN FLASH MEMORY DEVICE

(75) Inventors: Cha Deok Dong, Icheon-si (KR); Il Keoun Han, Icheon-si (KR)

(73) Assignee: Hynix Semiconductor Inc., Kyungki (KR)

( * ) Notice: Subject to any disclaimer, the term of this patent is extended or adjusted under 35 U.S.C. 154(b) by 0 days.

(21) Appl. No.: 10/744,495

(22) Filed: Dec. 23, 2003

(30) Foreign Application Priority Data

Sep. 8, 2003 (KR) .................................. 10-2003-0062485

(51) Int. Cl.⁷ .......................................... H01L 21/336
(52) U.S. Cl. ........................................................ 438/257
(58) Field of Search ................................ 438/257, 201, 438/211, 593

(56) References Cited

U.S. PATENT DOCUMENTS

2002/0068398 A1 * 6/2002 Dong et al. ................. 438/201

* cited by examiner

Primary Examiner—Craig A. Thompson
(74) Attorney, Agent, or Firm—Marshall, Gerstein & Borun LLP

(57) ABSTRACT

Provided is a method of forming a gate electrode in a flash memory device including the steps of sequentially forming a tunnel oxide film and an undoped first polysilicon film on a semiconductor substrate, forming a doped second polysilicon film having a given doping concentration on the undoped first polysilicon film, sequentially forming a dielectric film and a third polysilicon film on the results, patterning the results to form a floating gate electrode pattern, a dielectric film and a control gate electrode pattern, and performing an oxidization process for the results to form a sidewall oxide film in the floating gate electrode pattern and the sidewall of the control gate electrode pattern. As such, by using the second polysilicon film having the given doping concentration, a thickness of the sidewall oxide film formed at the gate electrode sidewall can be uniformly controlled. It is therefore possible to secure the CD of a gate electrode.

5 Claims, 3 Drawing Sheets

METHOD OF FORMING GATE ELECTRODE IN FLASH MEMORY DEVICE

BACKGROUND

1. Field of the Invention

The present invention relates to a method of fabricating a flash memory device and, more specifically, to a method of forming a gate electrode in a flash memory device.

2. Discussion of Related Art

In forming a gate electrode of a typical flash memory device, a doped polysilicon film of 4.7E20 atoms/cc or more is usually used so as to form a floating gate electrode having surface resistance (Rs) and an adequate concentration necessary for the operation of the gate electrode.

Meanwhile, the gate electrode formed using the doped polysilicon film having the above concentration is experienced by an oxidization process for compensating for the loss due to an etch process that is performed to form a gate electrode pattern, thereby forming a sidewall oxide film at the sidewall of the gate electrode pattern. In this case, the sidewall oxide film is formed thicker several times than a thickness of a desired oxide film. In other words, the doped polysilicon film of 4.7E20 atoms/cc or more reacts to a large amount of oxygen ions generated during the oxidization process for forming the sidewall oxide film to form an oxide film. For this reason, it results in an oxide film thicker several times than a thickness of a desired sidewall oxide film.

Therefore, due to such thick sidewall oxide film, in case of a tunnel oxide film formed at the bottom of the floating gate electrode, there is a problem that the edge of the tunnel oxide film is formed thicker than the center of the tunnel oxide film. There is also a problem that a smiling condition that an oxide film is formed at neighboring film quality happens in the oxide film of an ONO dielectric film formed at the top of the floating gate electrode.

Accordingly, there is a problem that it is impossible to secure the critical dimension (CD) of a gate electrode due to an unwanted region and an oxide film of an unwanted thickness.

SUMMARY OF THE INVENTION

The present invention is directed to a method of forming a gate electrode in a flash memory device that can secure the critical dimension (CD) of a gate electrode by uniformly controlling a thickness of a sidewall oxide film formed in a gate electrode sidewall.

According to a preferred embodiment of the present invention, there is provided a method of forming a gate electrode in a flash memory device, comprising the steps of sequentially forming a tunnel oxide film and an undoped first polysilicon film on a semiconductor substrate; forming a doped second polysilicon film having a doping concentration of about 1.0 to 1.7E20 atoms/cc on the undoped first polysilicon film; sequentially forming a dielectric film and a third polysilicon film on the doped second polysilicon film; patterning the resultant structure to form a floating gate electrode pattern, a dielectric film and a control gate electrode pattern; and performing an oxidization process for the resultant structure to form a sidewall oxide film in the floating gate electrode pattern and the sidewall of the control gate electrode pattern.

In the above, it is preferred that the first polysilicon film is formed in a thickness of about 250 to 500 Å at a temperature of about 480 to 550° C. and a pressure of 0.1 to 3 torr by means of a LP-CVD method using a Si source gas.

Further, it is preferable that the second polysilicon film is formed in a thickness of about 1200 to 2000 Å at a temperature of 480 to 550° C. and a pressure of 0.1 to 3 torr by means of a LP-CVD method using a Si source gas and a P source gas.

The oxidization process preferably includes forming a sidewall oxide film of 30 to 50 Å in a thickness at a temperature of about 750 to 950° C. by means of a dry oxidization mode in which an oxidization rate can be controlled readily.

It is preferred that the method further comprising the steps of patterning the first polysilicon film, the tunnel oxide film and the semiconductor substrate by a given depth, to form a trench so that an isolation region is defined for the resultant structure in which the first polysilicon film is formed, and burying the trench with an oxide film to form an isolation film.

DETAILED DESCRIPTION OF PREFERRED EMBODIMENTS

Figure 1:
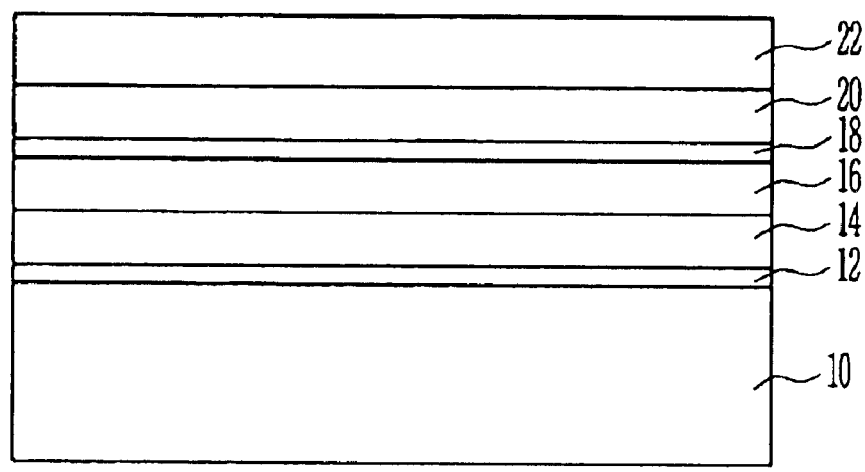
FIG. 1 and FIG. 2 are cross-sectional views for explaining a method of forming a gate electrode in a flash memory device according to a preferred embodiment of the present invention.

Now, the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later. Further, in the drawing, the thickness and size of each layer are exaggerated for convenience of explanation and clarity. Like reference numerals are used to identify the same or similar parts. Meanwhile, in case where it is described that one film is "on" the other film or a semiconductor substrate, the one film may directly contact the other film or the semiconductor substrate. Or, a third film may be intervened between the one film and the other film or the semiconductor substrate.

Figure 2:
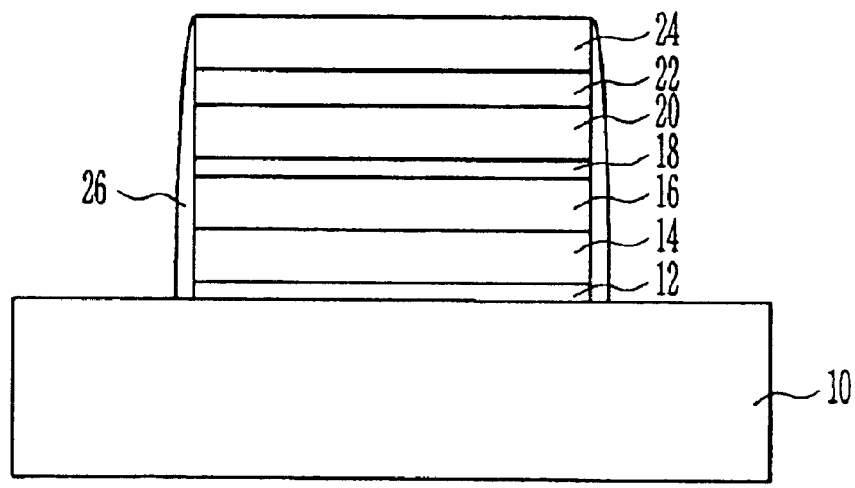

FIG. 1 and FIG. 2 are cross-sectional views for explaining a method of forming a gate electrode in a flash memory device according to a preferred embodiment of the present invention.

Referring to FIG. 1, a tunnel oxide film 12 and a first polysilicon film 14 for a floating gate electrode are sequentially formed on a semiconductor substrate 10. At this time, the semiconductor substrate 10 has been divided into a PMOS region and an NMOS region. Furthermore, an ion implantation process for forming a well region and an ion implantation process for controlling the threshold voltage have been implemented for the semiconductor substrate 10.

The tunnel oxide film 12 is formed at a temperature of about 750 to 800° C. in a wet or dry oxidization mode. Thereafter, the tunnel oxide film 12 may be annealed at a temperature of 850 to 900° C. under a gas atmosphere of $N_2$ for 20 to 30 minutes.

The first polysilicon film 14 for the floating gate electrode may be formed in a thickness of about 250 to 500 Å at a temperature of about 480 to 550° C. and a pressure of about 0.1 to 3 torr by means of a low pressure chemical vapor deposition (hereinafter, referred to as "LP-CVD") method. In this case, it is preferred that the first polysilicon film 14 is formed using an undoped amorphous polysilicon film having a low anti-oxidative property.

After forming a pad nitride film (not shown) on the first polysilicon film 14, a photoresist pattern (not shown) is formed. The pad nitride film (not shown), the first polysilicon film 14, the tunnel oxide film 12 and the semiconductor substrate 10 are then etched using the photoresist pattern as an etch mask, thereby forming a trench (not shown) defining an isolation film. After a high-density plasma (HDP) oxide film having a good gap fill property is deposited to fill the trench (not shown), a polishing process such as a chemical mechanical polishing (CMP) process is performed until the pad nitride film (not shown) is exposed, so that the isolation film (not shown) is formed. The pad nitride film (not shown) is then removed by an etch process.

Thereafter, a second polysilicon film 16 for a floating gate electrode, a dielectric film 18, a third polysilicon film 20 for a control gate electrode, and a metal silicide film 22 are sequentially formed on the resultant structure.

In the above, the second polysilicon film 16 for a floating gate electrode may be formed in a thickness of about 1200 to 2000 Å by means of the same process as that of the first polysilicon film. In this case, it is preferred that the second polysilicon film 16 is formed using a doped polysilicon film having a doping concentration of about 1.0 to 1.7E20 atoms/cc.

It is preferable that the dielectric film 18 is formed in an ONO structure, i.e., a structure in which a first oxide film, a nitride film and a second oxide film are sequentially stacked. At this time, the first oxide film and the second oxide film may be formed in a thickness of about 35 to 60 Å at a temperature of about 700 to 850° C. and a pressure of about 0.1 to 3 torr by means of the LP-CVD method. Also, the first and the second oxide films may be formed using a high temperature oxide (HTO) film using $SiH_2Cl_2$ (dichlorosilane; DCS) and a $N_2O$ gas as a source gas. The nitride film may be formed in a thickness of about 50 to 65 Å at a temperature of about 600 to 750° C. and a pressure of about 0.1 to 3 torr by means of the LP-CVD method using $NH_3$ and $SiH_2Cl_2$ gases as a reaction gas. Thereafter, after the dielectric film 18 is completely formed, a steam anneal process of a wet oxidization mode is performed at a temperature of about 750 to 800° C. in order to improve the properties of the dielectric film 18 and reinforce the boundary between respective film quality. The steam anneal process is preferably performed with no time delay from the deposition of the dielectric film 18 so that contamination due to a native oxide film or impurities does not occur.

The third polysilicon film 20 for a control gate electrode may be formed at a temperature of about 500 to 550° C. and pressure of about 0.1 to 3 torr by means of the LP-CVD method using a Si source gas such as $SiH_4$ or $SiH_6$ and a $PH_3$ gas. It is preferred that the third polysilicon film 20 is formed in thickness of about 700 to 1500 Å. The third polysilicon film 20 may be formed using an amorphous polysilicon film of the same doping concentration as the second polysilicon film 16 for a floating gate electrode, i.e., a doping concentration of about 1.0 to 1.7E20 atoms/cc.

The metal silicide film 22 is formed using a tungsten silicide film in a thickness of about 1000 to 1200 Å by means of a reaction of $SiH_4$ (monosilane: MS) or $SiH_2Cl_2$ (dichlorosilane: DCS) and $WF_6$. Stoichiometry of the metal silicide film 22 is controlled 2.0 to 2.8 in order to minimize the sheet resistance of a film quality, while implementing a good step coverage at a temperature of 300 to 500° C.

Referring to FIG. 2, after forming a nitride film 24 for a hard mask in a given region of the resulting surface, an etch process is performed using the nitride film 24 as an etch mask to form a gate electrode pattern (G.P).

Next, a sidewall oxide film 26 is formed on the resultant structure by an oxidization process. Before the oxidization process is performed, a pre-treatment cleaning process using standard cleaning-1 (SC-1: solution in which $NH_4OH/H_2O_2/H_2O$ are mixed in a given ratio) is performed. The sidewall oxide film 26 is formed to compensate for etch damage occurring against the sidewall during the etch process for forming the gate electrode pattern (G.P). At this time, the sidewall oxide film 18 may be formed in thickness of about 30 to 50 Å at a temperature of about 750 to 950° C. by means of a dry oxidization mode that can easily control an oxidization rate. The flow of an oxygen gas at this time may be about 1 to 10 slm.

Meanwhile, in case where a floating gate electrode is formed of a second polysilicon film having a high doping concentration and an undoped first polysilicon film, doping profiles of the first and second polysilicon films vary due to heat applied during the process. At this time, the doping concentration of the second polysilicon film and a doping concentration at the interface of the first and second polysilicon films also vary. The greater a difference between these two doping concentrations, the greater a tendency to the oxidization of the polysilicon film when a subsequent oxide film is formed. For this reason, it was impossible to control the thickness of the sidewall oxide film formed at the sidewall of the gate electrode pattern.

Figure 3:
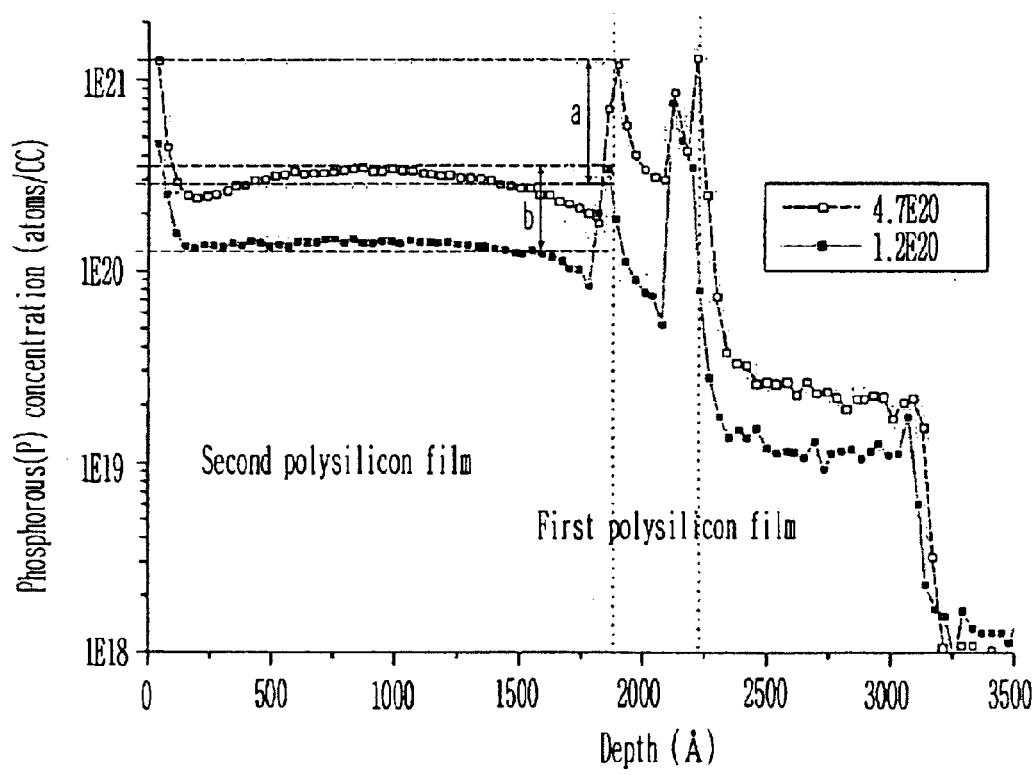
FIG. 3 is graphs showing a doping profile of a second polysilicon film having a given doping concentration and a first polysilicon film in a related art, and a doping profile of a second polysilicon film having a given doping concentration and a first polysilicon film according to the present invention.

In order to prove this explanation, there are shown in FIG. 3 a graph showing doping profiles of first and second polysilicon films, indicating the results of a second polysilicon film having a doping concentration of about 4.7E20 atoms/cc and an undoped first polysilicon film, which are deformed after the annealing process applied during the process in a prior art, and a graph showing doping profiles of first and second polysilicon films, indicating the results of a second polysilicon film having a doping concentration of about 1.0 to 1.7E20 atoms/cc, i.e., 1.2E20 atoms/cc and an undoped first polysilicon film, which are formed after the annealing process performed during the process according to the present invention.

In a prior art, in the case where the second polysilicon film having the high doping concentration, i.e., about 4.7E20 atoms/cc is formed, there is a difference in the concentration as much as "a" shown in FIG. 3. In the case where the second polysilicon film having a low doping concentration, i.e., about 1.0 to 1.7E20 atoms/cc is formed, there is a difference in the concentration as much as "b" shown in FIG. 3. From the above, it can be understood that the difference between a doping concentration of the second polysilicon film and a doping concentration at the interface between the first and second polysilicon films in the prior art is greater than the difference between the doping concentration of the second polysilicon film and the doping concentration at the interface between the first and second polysilicon films according to the present invention.

Therefore, since the doping concentration of the second polysilicon film, the doping concentration at the interface between the first and second polysilicon films, etc. become relatively very small, a tendency to oxidization of the polysilicon film in a subsequent process for forming an oxide film is reduced. It is therefore possible to control the thickness of the sidewall oxide film formed at the sidewall of the gate electrode pattern.

Figure 4:
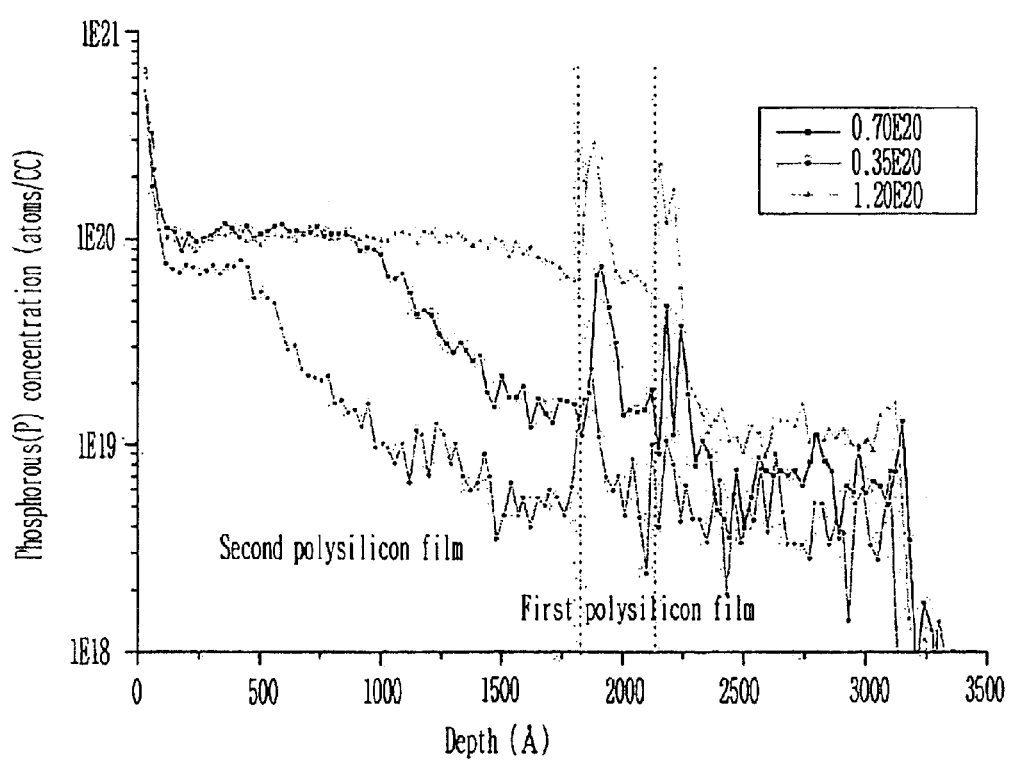
FIG. 4 is graphs showing a doping profile of a second polysilicon film having a first doping concentration and a first polysilicon film and a doping profile of a second polysilicon film having a second doping concentration lower than the first doping concentration and a first polysilicon film according to the present invention.

Furthermore, there are shown in FIG. 4 a graph showing doping profiles of first and second polysilicon films, indicating the results of the second polysilicon film having a doping concentration of about 1.0 to 1.7E20 atoms/cc, i.e., 1.2E20 atoms/cc and the undoped first polysilicon film, which are deformed after the annealing process performed during the process, and a graph showing doping profiles of the first and second polysilicon films, indicating the results of a second polysilicon film having a doping concentration of about 0.35 to 0.70 atoms/cc and an undoped first polysilicon film, which are deformed after the annealing process performed during the process according to the present invention.

Referring to FIG. 4, since the doping profile of the second polysilicon film having the doping concentration of about 0.35 to 0.70 atoms/cc is not uniform compared to the doping profile of the second polysilicon film having the doping concentration of about 1.2E atoms/cc, there is a significant difference between the doping concentration of the second polysilicon film and the doping concentration at the interface between the first and second polysilicon films. Accordingly, in a subsequent process for forming an oxide film, a tendency to the oxidization of the polysilicon film is increased and a depletion region is formed in the gate. This makes it impossible to control the thickness of the sidewall oxide film formed at the sidewall of the gate electrode pattern, causes an effective thickness of the tunnel oxide film to increase, and results in variation of a high threshold voltage. For this reason, a second polysilicon film having the doping concentration of about 1.2E atoms/cc according to the present invention is preferred.

According to the present invention, by using a second polysilicon film having a doping concentration of about 1.0 to 1.7E20 atoms/cc, it is possible to uniformly control a thickness of a sidewall oxide film formed at the sidewall of a gate electrode. Furthermore, since the thickness of the sidewall oxide film is controlled, a thickness of an oxide film of an ONO dielectric film and a thickness of a tunnel oxide film can remain intact, so that a smiling phenomenon of the ONO dielectric film and the tunnel oxide film is prohibited. As a result, as the thickness of the ONO dielectric film can be efficiently prevented from increasing, a coupling ratio margin of a floating gate electrode can be easily secured, and cell-operating characteristics can be enhanced while reinforcing isolation of the floating gate electrode.

Therefore, by uniformly controlling the thickness of the sidewall oxide film, it is possible to secure the CD of the gate electrode.

According to the present invention described above, by using a second polysilicon film having a doping concentration of about 1.0 to 1.7E20 atoms/cc, it is possible to uniformly control a thickness of a sidewall oxide film formed at the sidewall of a gate electrode. Therefore, the present invention has an effect that it can secure the CD of a gate electrode.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method of forming a gate electrode in a flash memory device, comprising the steps of:

sequentially forming a tunnel oxide film and an undoped first polysilicon film on a semiconductor substrate;

forming a doped second polysilicon film having a doping concentration of about 1.0 to 1.7E20 atoms/cc on the undoped first polysilicon film;

sequentially forming a dielectric film and a third polysilicon film on the doped second polysilicon film;

patterning the resultant structure to form a floating gate electrode pattern, a dielectric film and a control gate electrode pattern; and performing an oxidization process for the resultant structure to form a sidewall oxide film in the floating gate electrode pattern and the sidewall of the control gate electrode pattern.

2. The method as claimed in claim 1, wherein the first polysilicon film is formed in a thickness of about 250 to 500 Å at a temperature of about 480 to 550° C. and a pressure of 0.1 to 3 torr by means of a LP-CVD method using a Si source gas.

3. The method as claimed in claim 1, wherein the second polysilicon film is formed in a thickness of about 1200 to 2000 Å at a temperature of 480 to 550° C. and a pressure of 0.1 to 3 torr by means of a LP-CVD method using a Si source gas and a P source gas.

4. The method as claimed in claim 1, wherein the oxidization process includes forming a sidewall oxide film of 30 to 50 Å in a thickness at a temperature of about 750 to 950° C. by means of a dry oxidization mode, in which an oxidization rate can be controlled readily.

5. The method as claimed in claim 1, further comprising the steps of, before the step of forming the second polysilicon film, patterning the first polysilicon film, the tunnel oxide film and the semiconductor substrate by a given depth, to form a trench so that an isolation region is defined for the resultant structure in which the first polysilicon film is formed; and burying the trench with an oxide film to form an isolation film.

* * * * *

UNITED STATES PATENT AND TRADEMARK OFFICE
CERTIFICATE OF CORRECTION

PATENT NO. : 6,803,277 B1
DATED : October 12, 2004
INVENTOR(S) : Dong et al.

It is certified that error appears in the above-identified patent and that said Letters Patent is hereby corrected as shown below:

<u>Title page,</u>
Item [75], Inventors, please delete "Cha Deok Dong, Icheon-si (KR)" and insert
-- Cha Deok Dong, Gyeonggi-do (KR) -- in its place; and please delete "Il Keoun Han, Icheon-si (KR)" and insert -- Il Keoun Han, Gyeonggi-do (KR) -- in its place.
Item [73], Assignee, after "Hynix Semiconductor Inc.," please delete "Kyungki (KR)" and insert -- Kyungki-do (KR) -- in its place.

Signed and Sealed this

Twelfth Day of April, 2005

JON W. DUDAS
*Director of the United States Patent and Trademark Office*